(12) United States Patent
Higashide et al.

(10) Patent No.: US 6,828,799 B2
(45) Date of Patent: Dec. 7, 2004

(54) PROPAGATION DELAY TIME MEASURING METHOD AND TESTING APPARATUS

(75) Inventors: Koichi Higashide, deceased, late of Tokyo (JP); by Satoko Higashide, legal representative, Kamakura (JP); Yukio Ishigaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/646,352

(22) Filed: Aug. 22, 2003

(65) Prior Publication Data

US 2004/0124852 A1 Jul. 1, 2004

Related U.S. Application Data

(63) Continuation of application No. PCT/JP02/01790, filed on Feb. 27, 2002.

(30) Foreign Application Priority Data

Feb. 27, 2001 (JP) ........................................ 2001-052230

(51) Int. Cl.[7] .............................................. G01R 27/28
(52) U.S. Cl. ...................................................... 324/617
(58) Field of Search ................................ 324/765, 617, 324/601, 158.1, 130, 76.54; 702/125, 117–118, 89, 40; 714/700

(56) References Cited

U.S. PATENT DOCUMENTS

| | | | | |
|---|---|---|---|---|
| 5,703,489 A | * | 12/1997 | Kuroe | 324/601 |
| 5,867,030 A | | 2/1999 | Sato | |
| 6,269,051 B1 | * | 7/2001 | Funaba et al. | 365/233 |
| 6,356,096 B2 | * | 3/2002 | Takagi et al. | 324/765 |
| 6,479,983 B1 | * | 11/2002 | Ebiya | 324/158.1 |
| 6,549,000 B2 | * | 4/2003 | Ebiya | 324/158.1 |
| 6,556,934 B2 | * | 4/2003 | Higashide | 702/89 |
| 2003/0125897 A1 | * | 7/2003 | Higashide | 702/118 |

FOREIGN PATENT DOCUMENTS

| | | |
|---|---|---|
| JP | 8-36037 | 2/1996 |
| JP | 2000-9801 | 1/2000 |
| JP | 2000-352578 | 12/2000 |

OTHER PUBLICATIONS

Translation of International Preliminary Examination Report issued in PCT/JP02/01790 mailed Apr. 2, 2003, 4 pgs.
Patent Abstracts of Japan, Publication No. 2000–352578, Dec. 19, 2000, 1 pg.
Patent Abstracts of Japan, Publication No. 2000–009801, Jan. 14, 2000, 1 pg.
Patent Abstracts of Japan, Publication No. 08–036037, Feb. 6, 1996, 1 pg.
International Search Report issued in PCT/JP02/01790 mailed May 21, 2002, 2 pgs.
International Preliminary Examination Report issued in PCT/JP02/01790 mailed Apr. 2, 2003, 4 pgs.

* cited by examiner

*Primary Examiner*—David Zarneke
*Assistant Examiner*—Jermele Hollington
(74) *Attorney, Agent, or Firm*—Osha & May L.L.P.

(57) ABSTRACT

A propagation delay time measuring method of measuring a propagation delay time of a test signal propagating along one of a first signal path serially connecting to the first signal path through which a semiconductor testing apparatus includes a driver and a comparator electrically connected to a device under test.

8 Claims, 4 Drawing Sheets

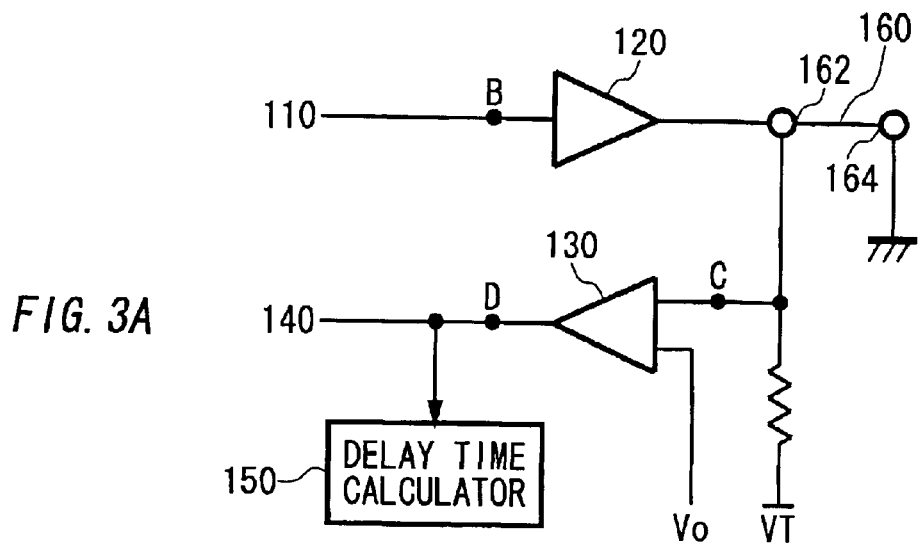
FIG. 3A
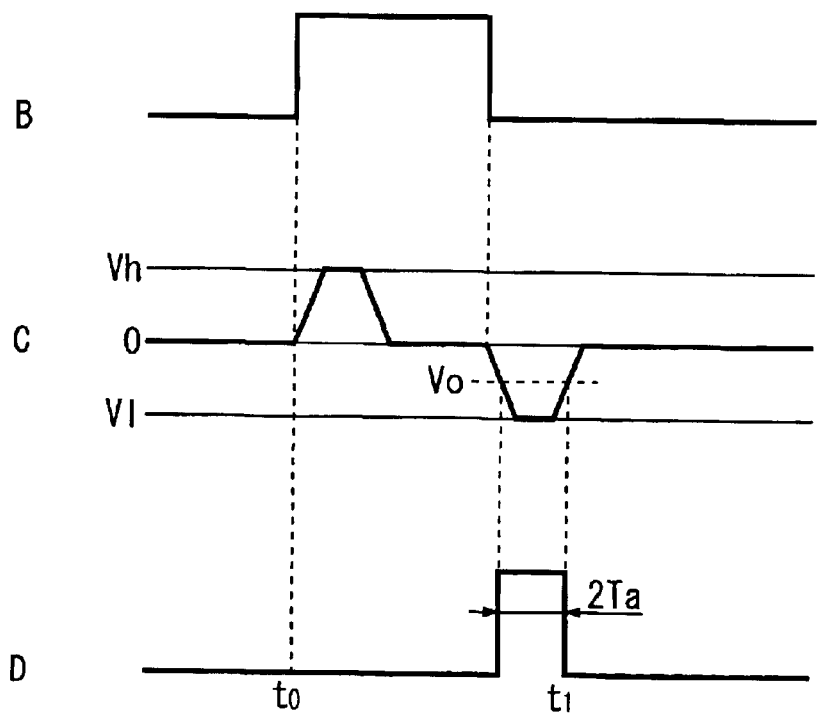
FIG. 3B
FIG. 3C
FIG. 3D

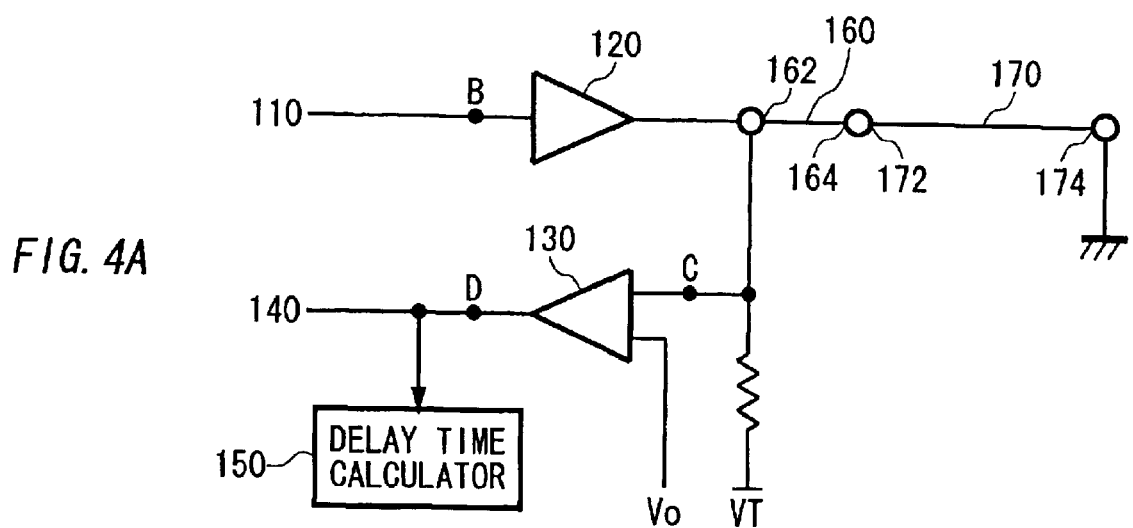
FIG. 4A
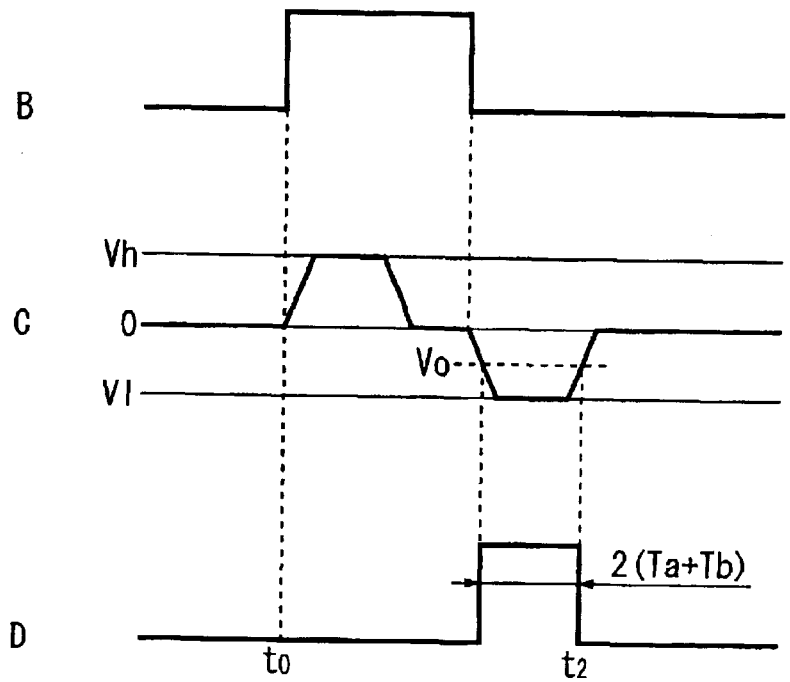
FIG. 4B
FIG. 4C
FIG. 4D

PROPAGATION DELAY TIME MEASURING METHOD AND TESTING APPARATUS

The present application is a continuation application of PCT/JP02/01790 filed on Feb. 27, 2002, claiming priority from a Japanese Patent Application No. 2001-52230 filed on Feb. 27, 2001, the contents of which are incorporated herein by reference.

BACKGROUND OF THE INVENTION

1. Field of the Invention

The present invention relates to a propagation delay time measuring method and a testing apparatus.

2. Related Art

A semiconductor testing apparatus is electrically connected with a device under test by a path which transfers a test signal output of a driver, and it is essential to measure the propagation delay time of the path correctly in order to test the semiconductor testing apparatus accurately. The Japanese Patent Application Laid-Open No.1996-36037 (Application date Feb. 6, 1996) discloses a delay time measuring circuit which measures a propagation delay time of the path which connects the semiconductor testing apparatus and the device under test, by connecting a grounded device, instead of the device under test, to an end of the path, and by receiving at a comparator both the test signal output of the driver and the test signal output of the driver and then reflected at the grounding point.

In recent years, with accelerating of the semiconductor testing apparatus, it is necessary to test the semiconductor testing apparatus accurately and it is also necessary to calibrate accurately the semiconductor testing apparatus. Therefore, there has been a known problem that a rise/fall characteristic of test signals of the driver, the comparator, etc affects the accuracy of the measurement when calibrating the semiconductor testing apparatus.

Alternatively, the delay time measuring circuit disclosed by the Japanese Patent Application Laid-Open No.1996-36037 has a problem that when measuring the propagation delay time, a measurement error of the propagation delay time occurs by a rise/fall characteristic of the comparator, because the delay time measuring circuit detects both a rise edge of the test signal output of the driver, and a fall edge of the test signal output of the driver reflected at the grounding point.

Accordingly, it is an object of the present invention to solve the foregoing problem.

SUMMARY OF THE INVENTION

In order to achieve these desired objectives, according to the first aspect of the present invention, a propagation delay time measuring method of measuring a propagation delay time of a test signal propagating along one of a first signal path and a second signal path serially connecting to the first signal path through which a semiconductor testing apparatus includes a driver and a comparator electrically connected to a device under test device under test, includes: a first connecting step of connecting an end of the first path to the driver and the comparator; a first output step of outputting a test signal from the driver to the first path; a first reflect signal receiving step of receiving a test signal at the comparator, as a first reflect signal, reflected at another end of the first path; a first timing detecting step of detecting a timing, defined as a first timing, when the first reflect signal obtained by the comparator reaches a predetermined level; a second connecting step of connecting an end of the second path to another end of the first path; a second output step of outputting the test signal from the driver to the second path; a second reflect signal receiving step of receiving a test signal at the comparator, defined as a second reflect signal, reflected at another end of the second path; a second timing detecting step of detecting a timing, defined as a second timing, when the second reflect signal obtained by the comparator reaches the predetermined level; and a delay time calculation step of calculating of the propagation delay time of the second path, based on the reference timing corresponding to a timing when the delay time calculator outputs the test signal, the first timing, and the second timing.

The first connecting step may include a first grounding step of grounding another end of first path and the second connecting step may include a second grounding step of grounding another end of the second path.

The first timing detecting step may include a step of detecting the first timing when a rise edge of the first reflect signal reaches the predetermined level and the second timing detecting step may include a step of detecting the second timing when a rise edge of the second reflect signal reaches the predetermined level.

The first timing detecting step may include a step of detecting the first timing when a fall edge of the first reflect signal reaches the predetermined level and the second timing detecting step may include a step of detecting the second timing when a fall edge of the second reflect signal reaches the predetermined level.

The reference timing is defined as a timing when the driver outputs the test signal and the delay time calculation step may include a step of calculating the propagation delay time, based on a first timing interval which is defined as a interval from the reference timing to the first timing, and a second timing interval which is defined as a interval from the reference timing to the second timing.

The propagation delay time measuring method in the first aspect may further include a repetition step of repeatedly repeating the first output step, the first reflect signal output step, and a step of supplying the test signal to the driver from the comparator, based on a signal output of the comparator corresponding to the obtained first reflect signal, and the delay time calculation step may further include a step of calculating the first timing interval based on a repeating period of the repetition step.

The propagation delay time measuring method in the first aspect may further include an another repetition step of repeatedly repeating the second output step, the second reflect signal output step, and a step of supplying the test signal to the driver from the comparator, based on a signal output of the comparator corresponding to the obtained second reflect signal, and the delay time calculation step may further include a step of calculating the second timing interval based on a repeating period of the another repetition step.

According to the second aspect of the present invention, a semiconductor testing apparatus for supplying a test signal to semiconductor devices so as to test the semiconductor devices includes: a driver which outputs the test signal; a comparator which receives the test signal; a first path of which an end is connected to the driver and the comparator; a second path of which an end is connected to another end of the first path and of which another end is connected to a device under test; a delay time calculator which calculate a propagation delay time of the second path, based on a timing, defined as a first reflect signal which is output from the driver and reflected at the end of another end of the first path, when the first reflect signal reaches a predetermined level, and based on a timing, defined as a first reflect signal which is output from the driver and reflected at the end of another end of the second path, when the second reflect signal reaches a predetermined level.

BRIEF DESCRIPTION OF THE DRAWINGS

FIG. 3A is a circuit diagram explaining a first measurement step in FIG. 2.

FIG. 3B is a timing diagram showing a waveform of a test signal input into a driver 120 at a point B shown in FIG. 3A.

FIG. 3C is a timing diagram showing a waveform of a test signal received by a comparator 130 at a point C shown in FIG. 3A.

FIG. 3D is a timing diagram showing a waveform of a test signal output of a comparator 130 at a point D shown in FIG. 3A.

FIG. 4A is a circuit diagram explaining a second measurement step in FIG. 2.

FIG. 4B is a timing diagram showing a waveform of a test signal input into a driver 120 at a point B shown in FIG. 4A.

FIG. 4C is a timing diagram showing a waveform of a test signal received by a comparator 130 at a point C shown in FIG. 4A.

FIG. 4D is a timing diagram showing a waveform of a test signal output of a comparator 130 at a point D shown in FIG. 4A.

DETAILED DESCRIPTION OF THE INVENTION

Figure 1:
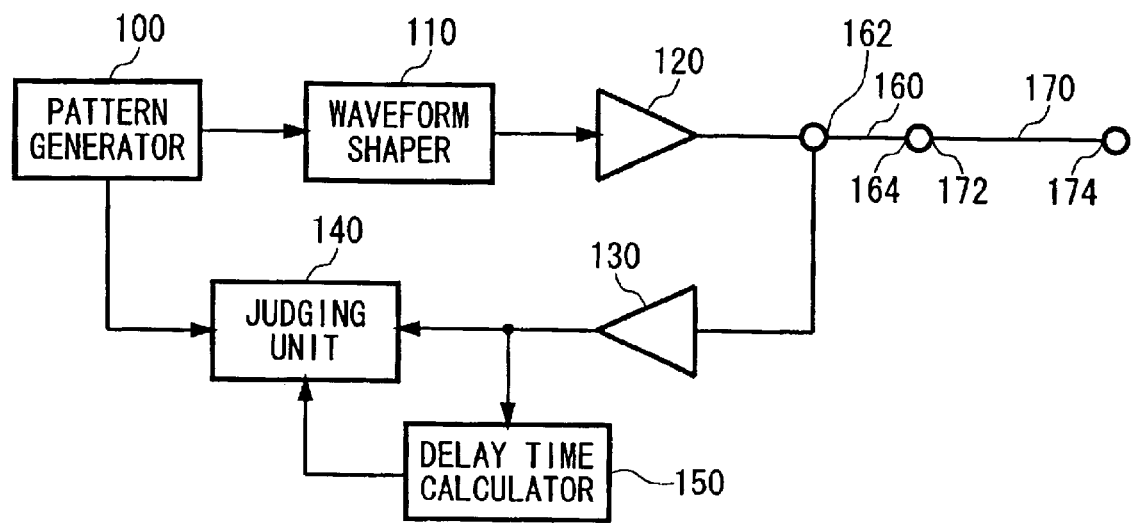
FIG. 1 is a block diagram showing a configuration of a semiconductor testing apparatus 10 according to an embodiment of the present invention.

One of embodiments will now be described referring to the drawings.

FIG. 1 is a block diagram showing a configuration of a semiconductor testing apparatus 10 according to an embodiment of the present invention. The semiconductor testing apparatus 10 includes: a pattern generator 100 for generating pattern data of a test signal which is input into a device under test; a waveform shaper 110 for shaping the pattern data; a driver 120 for supplying the shaped pattern data to the device under test; a comparator 130 for receiving the pattern data output of the device under test; a judging unit 140 for judging the quality of the device under test; a first path 160 connecting the driver 120 and the comparator 130; a second path 170 connecting with the first path 160; and a delay time calculator 150 for calculating a propagation delay time of the first path 160 and the second path 170.

An end 162 of the first path 160 is connected to the driver 120 and the comparator 130, and another end 164 of the first path 160 is connected to the second path 170. An end 172 of the second path 170 is connected to the first path 160, and another end 174 of the second path 170 is connected to the device under test.

The first path 160 is arranged in the semiconductor testing apparatus 10 and, for example, connects the driver 120 and comparator 130 with a performance board. Therefore, the propagation delay time of the first path 160 is constant regardless of a variety of the performance boards. The second path 170 is arranged in the performance board and, for example, connects a test head and the device under test. Therefore, the propagation delay times of the second path 170 are different for the particular performance boards.

Therefore, the delay time calculator 150 calculates the propagation delay time of the second path 170 for each of the performance boards. Furthermore, the judging unit 140 compares the pattern data output of the device under test with the pattern data output of the pattern generator 100, based on the propagation delay time that is calculated by the delay time calculator 150. Therefore, the semiconductor testing apparatus 10 according to the present embodiment judges the quality of the device under test correctly by accurately calculating the propagation delay time of the second path 170.

Figure 2:
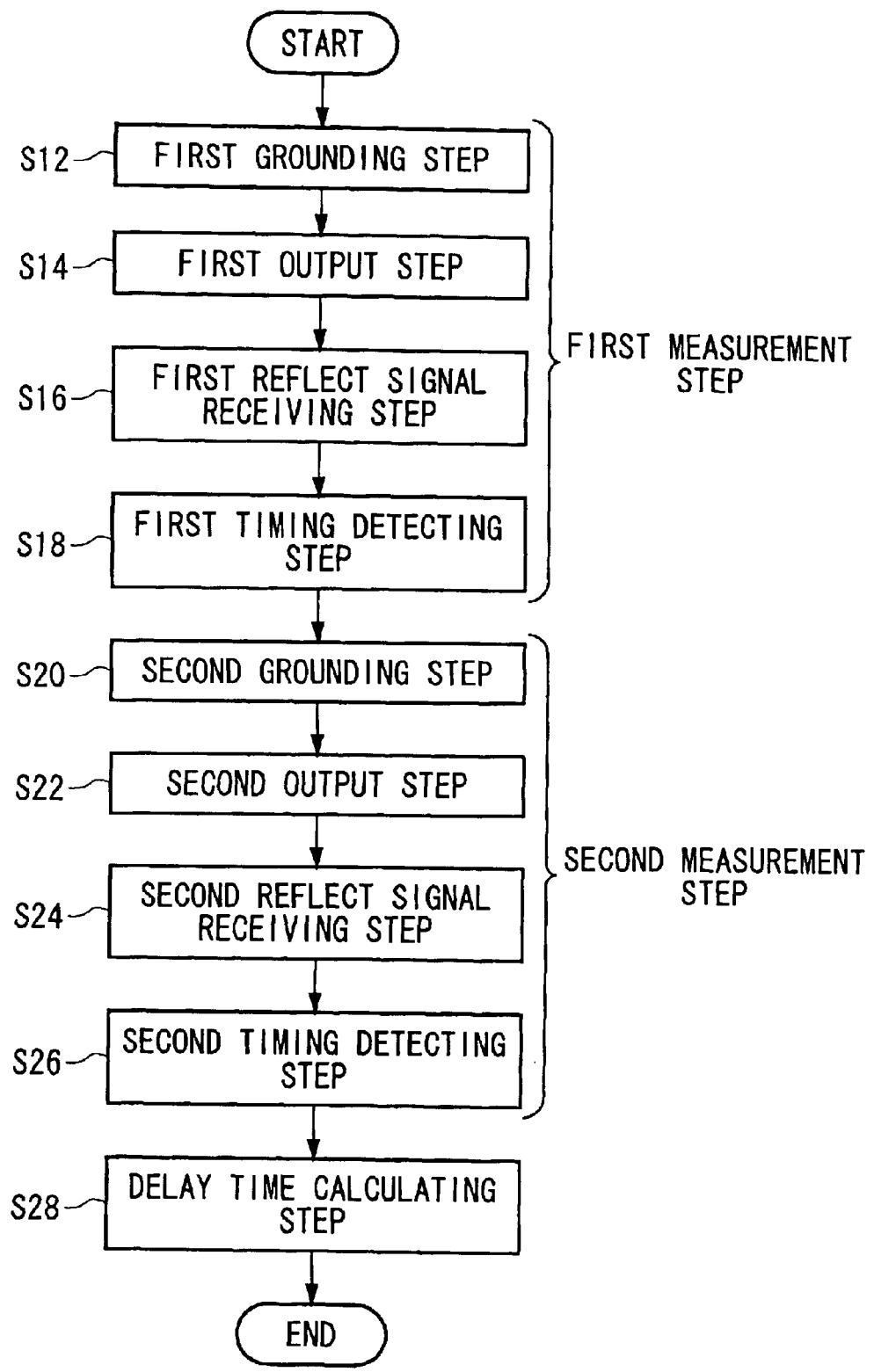
FIG. 2 is a flowchart showing a flowchart of a propagation delay time measuring method of the present embodiment.

FIG. 2 is a flowchart showing a propagation delay time measuring method of the present embodiment. The propagation delay time measuring method of the present embodiment includes: a first measurement step of measuring a first timing when the comparator 130 obtains the test signal, which is output of the driver 120 reflected at the grounding point where another end 164 of the first path 160 is grounded; a second step of measuring the second timing when the comparator 130 obtains the test signal, which is output of the driver 120 reflected at the grounding point where another end 174 of the second path 170 is grounded; a propagation delay time calculating step of calculating the propagation delay time of the second path 170, based on both first timing and second timing. The detail of each step will now be described.

FIGS. 3A, 3B, 3C and 3D are explanatory drawings of a first measurement step in FIG. 2. The first measurement step will be described by referring to FIG. 2 and FIG. 3. First as shown in FIG. 3A, in a first grounding step (S12), the end 162 of the first path 160 is connected to the driver 120 and the comparator 130, and another end 164 of the first path 160 is grounded. Next, in a first output step (S14), the driver 120 outputs the test signal received from the waveform shaper 110 to the grounded first path 160. For example, when the test signal is input into the driver 120 as a pulse wave, the waveform of the test signal input of the driver 120 is like the waveform shown in FIG. 3B at the point B shown in FIG. 3A.

Next, in a first reflect signal receiving step (S16), both the test signal output of the driver 120 in the first output step (S14), and the first reflect signal reflected at another end 164 of the first path 160 are added to a signal, and the signal is received by the comparator 130. For example, the waveform of the test signal received by the comparator 130 is like the waveform shown in FIG. 3C at the point C shown in FIG. 3A. Then the comparator 130 compares a predetermined threshold voltage value V0 with the received signal, and outputs a signal based on the result of the comparison. For example, when the comparator 130 outputs a high level signal at the time of receiving the voltage less than the value of V0, the waveform of the test signal output of the comparator 130 at the point D shown in FIG. 3A is like the waveform shown in FIG. 3D. At this time, the signal output of the comparator 130 has been the state of the high level for a period twice as long as a propagation delay time Ta of the first path 160.

Next, in a first timing detecting step (S18), based on the signal which the delay time calculator 150 receives from the comparator 130, a first timing t1, when the rise edge of the first reflect signal obtained by the comparator 130 reaches a predetermined level, i.e., a threshold voltage value V0, is detected. The first timing t1 is a timing based on a reference timing $t_0$ corresponding to a timing when the driver 120 outputs the test signal. For example, if the reference timing $t_0$ is assumed to be zero, the first timing t1 is given as a time interval from the reference timing $t_0$.

FIGS. 4A, 4B, 4C and 4D are explanatory drawings of a second measurement step in FIG. 2. The second measurement step will be described by referring to FIG. 2 and FIG. 4. First as shown in FIG. 4A, in a second ground step (S20), the end 172 of the second path 170 is connected to another end 164 of the first path 160, and another end 174 of the second path 170 is grounded. Next, in a second output step (S22), the test signal received from the waveform shaper 110 is output to the grounded first path 160. For example, when the test signal is input into the driver 120 as a pulse wave, the waveform of the test signal input of the driver 120 is like the waveform shown in FIG. 4B at the point B shown in FIG. 4A.

Next, in a second reflect signal receiving step (S24), both the test signal output of the driver 120 in the first output step (S22), and the second reflect signal reflected at another end 170 of the second path 170 are added to a signal, and the signal is received by the comparator 130. For example the waveform of the test signal received by the comparator 130 is like the waveform shown in FIG. 4C, at the point C shown in FIG. 4A. Then the comparator 130 compares a predetermined threshold voltage value V0 with the received signal, and outputs a signal based on the result of the comparison. For example, when the comparator 130 outputs a high level signal at the time of receiving the voltage less than the value of V0, the waveform of the test signal output from the comparator 130 at the point D shown in FIG. 4A is like the waveform at the point D shown in FIG. 4D. At this time, the signal output of the comparator 130 has been the state of the high level for a period twice as long as a sum time of the propagation delay time Ta of the first path 160 and the propagation delay time Tb of the second path 170.

Next, in a second timing detecting step (S26), based on the signal which the delay time calculator 150 receives from the comparator 130, a second timing t2, when the rise edge of the second reflect signal obtained by the comparator 130 reaches the predetermined level, i.e., a threshold voltage value V0, is detected. The second timing t2 is a timing based on the reference timing $t_0$ corresponding to a timing when the driver 120 outputs the test signal. For example, if the reference timing $t_0$ is assumed to be zero, the second timing t2 is given as a time interval from the reference timing $t_0$. In addition, the reference timing to described above is the same timing explained in FIG. 3D as the reference timing $t_0$ when driver 120 outputs the test signal.

A delay time calculating step (S28) will be described by referring to FIG. 2, FIG. 3, and FIG. 4. The delay time calculating step (S28) calculates a propagation delay time Tb of the second path 170, based on the reference timing $t_0$ corresponding to a timing when the delay time calculator 150 outputs the test signal, the first timing $t_1$, and the second timing $t_2$. Concretely, the delay time calculator 150 calculates the propagation delay time Tb of the second path 170 in accordance with the following equations.

$$t_2-t_2=2(Ta+Tb)-2Ta=2Tb$$

Thus, $$Tb=(t_2-t_1)/2$$

In the first timing detecting step (S18), based on the signal which the delay time calculator 150 receives from the comparator 130, the first timing $t_1$, when the fall edge of the first reflect signal obtained by the comparator 130 reaches the predetermined level, i.e., the threshold voltage value V0, may be detected, and in the second timing detecting step (S26), based on the signal which the delay time calculator 150 receives from the comparator 130, the second timing t2, when the fall edge of the second reflect signal obtained by the comparator 130 reaches the predetermined level, i.e. the threshold voltage value V0, may be detected. Although, in the foregoing description, the second measurement step is executed after the first measurement step, the first measurement step may be executed after the second measurement step.

Alternatively, the repetition step may be furthermore included, which repeats the first output step (S14), the first reflect signal output step (S16), and a step of supplying a test signal to the driver 120 from the pattern generator 100, based on the signal output of the comparator 130 corresponding to the obtained first reflect signal, repeatedly. Then, the delay time calculating step (S28) calculates a time interval between the reference timing and the first timing, based on the repeating period of the repetition step, so that the propagation delay time Tb of the second path 170 may be calculated.

Alternatively, another repetition step may be furthermore included, which repeats the second output step (S22), the second reflect signal output step (S24), and a step of supplying a test signal to the driver 120 from the pattern generator 100, based on the signal output of the comparator 130 corresponding to the obtained second reflect signal, repeatedly. Then, the delay time calculating step (S28) calculates a time interval between the reference timing and the second timing, based on the repeating period of another repetition step, so that the propagation delay time Tb of the second path 170 may be calculated.

According to the propagation delay time measuring method in this embodiment, in case the first timing is detected by the rise edge of the first reflect signal in the first timing detecting step (S18), the second timing is also detected by the rise edge of the second reflect signal in the second timing detecting step (S26), and in case the first timing is detected by the fall edge of the first reflect signal in the first timing detecting step (S18), the second timing is also detected by the fall edge of the second reflect signal in the second timing detecting step(S26), so that the propagation delay time Tb of the second path 170 can be calculated regardless of the difference between the rise time and the fall time caused by the characteristics of the driver 120 and the comparator 130.

Furthermore, according to the propagation delay time measuring method in this embodiment, the propagation delay time Tb of the second path 170 can be calculated regardless of the phase difference between the test signals output of the driver 120 and a signal output of the comparator 130 based on the received signal. Furthermore, according to the propagation delay time measuring method in this embodiment, a tester channel is used when measuring, so that the propagation delay time Tb of the second path 170 can be calculated regardless of the phase difference among channels.

As is apparent from the above, according to the propagation delay time measuring method, the propagation delay time of the path that connects the semiconductor testing apparatus and the device under test electrically can be measured accurately.

Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

What is claimed is:

1. A propagation delay time measuring method of measuring a propagation delay time of a test signal propagating along one of a first signal path and a second signal path serially connecting to the first signal path through which a semiconductor testing apparatus includes a driver and a comparator electrically connected to a device under test, the method comprising steps of;

a first connecting step of connecting an end of the first path to the driver and the comparator;

a first output step of outputting a test signal from the driver to the first path;

a first reflect signal receiving step of receiving a test signal at the comparator, defined as a first reflect signal, reflected at another end of the first path;

a first timing detecting step of detecting a timing, defined as a first timing, when the first reflect signal obtained by the comparator reaches a predetermined level;

a second connecting step of connecting an end of the second path to another end of the first path;

a second output step of outputting the test signal from the driver to the second path;

a second reflect signal receiving step of receiving a test signal at the comparator, defined as a second reflect signal, reflected at another end of the second path;

a second timing detecting step of detecting a timing, defined as a second timing, when the second reflect signal obtained by the comparator reaches the predetermined level; and a delay time calculation step of calculating of the propagation delay time of the second path, based on the reference timing corresponding to a timing when the delay time calculator outputs the test signal, the first timing, and the second timing.

2. A propagation delay time measuring method as claimed in claim 1, wherein the first connecting step includes a first grounding step of grounding another end of first path and the second connecting step includes a second grounding step of grounding another end of the second path.

3. A propagation delay time measuring method as claimed in claim 1, wherein the first timing detecting step includes a step of detecting the first timing when a rise edge of the first reflect signal reaches the predetermined level and the second timing detecting step includes a step of detecting the second timing when a rise edge of the second reflect signal reaches the predetermined level.

4. A propagation delay time measuring method as claimed in claim 1, wherein the first timing detecting step includes a step of detecting the first timing when a fall edge of the first reflect signal reaches the predetermined level and the second timing detecting step includes a step of detecting the second timing when a fall edge of the second reflect signal reaches the predetermined level.

5. A propagation delay time measuring method as claimed in claim 1, wherein the reference timing is defined as a timing when the driver outputs the test signal and the delay time calculation step includes; a step of calculating the propagation delay time, based on a first timing interval which is defined as a interval from the reference timing to the first timing, and a second timing interval which is defined as a interval from the reference timing to the second timing.

6. A propagation delay time measuring method as claimed in claim 5, further comprising:

a repetition step of repeatedly repeating the first output step, the first reflect signal output step, and a step of supplying the test signal to the driver from the comparator, based on a signal output of the comparator corresponding to the obtained first reflect signal and the delay time calculation step further includes a step of calculating the first timing interval based on a repeating period of the repetition step.

7. A propagation delay time measuring method as claimed in claim 5, further comprising:

an another repetition step of repeatedly repeating the second output step, the second reflect signal output step, and a step of supplying the test signal to the driver from the comparator, based on a signal output of the comparator corresponding to the obtained second reflect signal; and the delay time calculation step further includes a step of calculating the second timing interval based on a repeating period of another repetition step.

8. A semiconductor testing apparatus for supplying a test signal to semiconductor devices so as to test the semiconductor devices, the apparatus comprising:

a driver which outputs the test signal;

a comparator which receives the test signal;

a first path of which an end is connected with the driver and the comparator;

a second path an end of which is connected to another end of the first path and of which another end is connected to a device under test; and a delay time calculator which calculate a propagation delay time of the second path, based on a timing, defined as a first reflect signal which is output from the driver and reflected at the end of another end of the first path, when the first reflect signal reaches a predetermined level, and based on a timing, defined as a first reflect signal which is output from the driver and reflected at the end of another end of the second path, when the second reflect signal reaches a predetermined level.

* * * * *